United States Patent
Cowles et al.

(10) Patent No.: US 6,918,072 B2
(45) Date of Patent: Jul. 12, 2005

(54) CIRCUIT AND METHOD FOR TIME-EFFICIENT MEMORY REPAIR

(75) Inventors: Timothy B. Cowles, Boise, ID (US); Christian N. Mohr, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 606 days.

(21) Appl. No.: 09/864,682

(22) Filed: May 24, 2001

(65) Prior Publication Data

US 2002/0133770 A1 Sep. 19, 2002

Related U.S. Application Data

(63) Continuation-in-part of application No. 09/810,366, filed on Mar. 15, 2001.

(51) Int. Cl.[7] .............................................. G11C 29/00
(52) U.S. Cl. ..................................... 714/711; 714/719
(58) Field of Search ......................... 711/100; 365/200; 714/806, 710, 711, 719; 710/104

(56) References Cited

U.S. PATENT DOCUMENTS

| | | | | |
|---|---|---|---|---|
| 5,457,789 A | * | 10/1995 | Dietrich et al. ............. | 711/100 |
| 5,490,042 A | | 2/1996 | Perkins ........................ | 361/778 |
| 5,528,539 A | * | 6/1996 | Ong et al. ................... | 365/200 |
| 5,577,055 A | * | 11/1996 | Westerlund ................. | 714/805 |
| 5,655,105 A | | 8/1997 | McLaury ..................... | 395/496 |
| 5,706,292 A | * | 1/1998 | Merritt ........................ | 714/710 |
| 5,724,282 A | | 3/1998 | Loughmiller et al. ......... | 365/96 |
| 5,724,366 A | | 3/1998 | Furutani .................... | 371/21.2 |
| 5,748,543 A | | 5/1998 | Lee et al. .................... | 365/200 |
| 5,883,843 A | | 3/1999 | Hii et al. ..................... | 365/201 |
| 5,910,921 A | | 6/1999 | Beffa et al. .................. | 365/201 |
| 5,917,764 A | | 6/1999 | Ohsawa et al. ............. | 365/200 |
| 5,946,245 A | | 8/1999 | Brown et al. ................ | 365/201 |
| 5,959,929 A | | 9/1999 | Cowles et al. .......... | 365/230.03 |
| 6,018,811 A | * | 1/2000 | Merritt ........................ | 714/711 |
| 6,088,282 A | | 7/2000 | Loughmiller et al. ..... | 365/225.7 |
| 6,104,645 A | | 8/2000 | Ong et al. ................... | 365/200 |
| 6,115,828 A | | 9/2000 | Tsutsumi et al. .............. | 714/7 |
| 6,119,251 A | | 9/2000 | Cloud et al. ................. | 714/718 |
| 6,130,834 A | | 10/2000 | Mullarkey et al. ............ | 365/96 |
| 6,144,593 A | | 11/2000 | Cowles et al. .............. | 365/200 |
| 6,145,092 A | | 11/2000 | Beffa et al. ..................... | 714/7 |
| 6,154,398 A | | 11/2000 | Cutter et al. ................ | 365/200 |
| 6,154,851 A | | 11/2000 | Sher et al. ...................... | 714/5 |
| 6,163,860 A | * | 12/2000 | Merritt ........................ | 714/711 |
| 6,246,618 B1 | | 6/2001 | Yamamoto et al. ......... | 365/200 |
| 6,249,893 B1 | | 6/2001 | Rajsuman et al. .......... | 714/741 |
| 6,259,639 B1 | | 7/2001 | Hashizume ................. | 365/201 |
| 6,320,804 B2 | | 11/2001 | Dahn ......................... | 365/201 |
| 6,393,504 B1 | * | 5/2002 | Leung et al. ............... | 710/104 |
| 6,396,300 B1 | | 5/2002 | Loughmiller et al. ......... | 326/16 |
| 6,417,695 B1 | | 7/2002 | Duesman ..................... | 326/47 |
| 6,418,069 B2 | | 7/2002 | Schamberger et al. ...... | 365/200 |
| 6,550,023 B1 | | 4/2003 | Brauch et al. ................ | 714/42 |
| 6,560,728 B2 | * | 5/2003 | Merritt ........................ | 714/711 |
| 2001/0017806 A1 | | 8/2001 | Schamberger et al. ...... | 365/202 |

OTHER PUBLICATIONS

Cowles, Timothy B., "Circuit and Method for Test and Repair," U.S. Appl. No. 09/810,366, filed Mar. 15, 2001.

Micron Technology, Inc.; "Synchronous DRAM" Data Sheets; 128Mb: ×4, ×8, ×16 SDRAM, 128MSDRAM_Rev B_, p65; Pub. Oct. 2000, pp. 1–58.

Micron Technology, Inc.; "Synchronous DRAM" Data Sheets; 128Mb: ×32 SDRAM: ×32 DRAM, 128MbSDRAM×32, p65—Rev. Sep. 2000, pp. 1–52.

* cited by examiner

Primary Examiner—David Ton
(74) Attorney, Agent, or Firm—Charles Brantley

(57) ABSTRACT

Circuitry is provided to allow early switching of input signals from a first configuration directed to blow a first anti-fuse to a second configuration directed to blow a second anti-fuse, yet still allow complete blowing of the first anti-fuse. Such circuitry may be applied to methods of repairing a memory device after testing. Data concerning available repair cells may be stored in at least one on-chip redundancy register.

77 Claims, 12 Drawing Sheets

| | CLOCK CYCLE<br>PRIOR ART TEST METHOD | CLOCK CYCLE<br>EXEMPLARY TEST METHOD |
|---|---|---|
| 1 | WRITE TO 1ST ADDR OF CHIPS A, B, C, & D | WRITE TO 1ST ADDR OF CHIPS A, B, C, & D |
| 2 | WRITE TO 2ND ADDR OF CHIPS A, B, C, & D | WRITE TO 2ND ADDR OF CHIPS A, B, C, & D |
| 3 | WRITE TO 3RD ADDR OF CHIPS A, B, C, & D | WRITE TO 3RD ADDR OF CHIPS A, B, C, & D |
| 4 | WRITE TO 4TH ADDR OF CHIPS A, B, C, & D | WRITE TO 4TH ADDR OF CHIPS A, B, C, & D |
| 5 | READ FROM 1ST ADDR OF CHIP A | READ FROM 1ST ADDR OF CHIPS A, B, C, & D |
| 6 | READ FROM 2ND ADDR OF CHIP A | READ FROM 2ND ADDR OF CHIPS A, B, C, & D |
| 7 | READ FROM 3ND ADDR OF CHIP A | READ FROM 3RD ADDR OF CHIPS A, B, C, & D |
| 8 | READ FROM 4TH ADDR OF CHIP A | READ FROM 4TH ADDR OF CHIPS A, B, C, & D |
| 9 | READ FROM 1ST ADDR OF CHIP B | READ FAIL FLAG FROM A |
| 10 | READ FROM 2ND ADDR OF CHIP B | READ FAIL FLAG FROM B |
| 11 | READ FROM 3RD ADDR OF CHIP B | READ FAIL FLAG FROM C |
| 12 | READ FROM 4TH ADDR OF CHIP B | READ FAIL FLAG FROM D |
| 13 | READ FROM 1ST ADDR OF CHIP C | |
| 14 | READ FROM 2ND ADDR OF CHIP C | |
| 15 | READ FROM 3RD ADDR OF CHIP C | |
| 16 | READ FROM 4TH ADDR OF CHIP C | |
| 17 | READ FROM 1ST ADDR OF CHIP D | |
| 18 | READ FROM 2ND ADDR OF CHIP D | |
| 19 | READ FROM 3RD ADDR OF CHIP D | |
| 20 | READ FROM 4TH ADDR OF CHIP D | |

FIG. 2

| | CLOCK CYCLE<br>PRIOR ART TEST METHOD | CLOCK CYCLE<br>EXEMPLARY TEST METHOD |
|---|---|---|
| 1 | WRITE TO 1ST ADDR OF CHIPS A, B, C, & D | WRITE TO 1ST ADDR OF CHIPS A, B, C, & D |
| 2 | WRITE TO 2ND ADDR OF CHIPS A, B, C, & D | WRITE TO 2ND ADDR OF CHIPS A, B, C, & D |
| 3 | WRITE TO 3RD ADDR OF CHIPS A, B, C, & D | WRITE TO 3RD ADDR OF CHIPS A, B, C, & D |
| 4 | WRITE TO 4TH ADDR OF CHIPS A, B, C, & D | WRITE TO 4TH ADDR OF CHIPS A, B, C, & D |
| 5 | WRITE TO 5TH ADDR OF CHIPS A, B, C, & D | WRITE TO 5TH ADDR OF CHIPS A, B, C, & D |
| 6 | READ FROM 1ST ADDR OF CHIP A | READ FROM 1ST ADDR OF CHIPS A, B, C, & D |
| 7 | READ FROM 2ND ADDR OF CHIP A | READ FROM 2ND ADDR OF CHIPS A, B, C, & D |
| 8 | READ FROM 3RD ADDR OF CHIP A | READ FROM 3RD ADDR OF CHIPS A, B, C, & D |
| 9 | READ FROM 4TH ADDR OF CHIP A | READ FROM 4TH ADDR OF CHIPS A, B, C, & D |
| 10 | READ FROM 5TH ADDR OF CHIP A | READ FROM 5TH ADDR OF CHIPS A, B, C, & D |
| 11 | READ FROM 1ST ADDR OF CHIP B | READ FAIL FLAG FROM A |
| 12 | READ FROM 2ND ADDR OF CHIP B | READ FAIL FLAG FROM B |
| 13 | READ FROM 3RD ADDR OF CHIP B | READ FAIL FLAG FROM C |
| 14 | READ FROM 4TH ADDR OF CHIP B | READ FAIL FLAG FROM D |
| 15 | READ FROM 5TH ADDR OF CHIP B | |
| 16 | READ FROM 1ST ADDR OF CHIP C | |
| 17 | READ FROM 2ND ADDR OF CHIP C | |
| 18 | READ FROM 3RD ADDR OF CHIP C | |
| 19 | READ FROM 4TH ADDR OF CHIP C | |
| 20 | READ FROM 5TH ADDR OF CHIP C | |
| 21 | READ FROM 1ST ADDR OF CHIP D | |
| 22 | READ FROM 2ND ADDR OF CHIP D | |
| 23 | READ FROM 3RD ADDR OF CHIP D | |
| 24 | READ FROM 4TH ADDR OF CHIP D | |
| 25 | READ FROM 5TH ADDR OF CHIP D | |

FIG. 4

| # | CLOCK CYCLE PRIOR ART TEST METHOD | CLOCK CYCLE EXEMPLARY TEST METHOD |
|---|---|---|
| 1 | WRITE TO 1ST ADDR OF CHIPS A, B, C, D, & E | WRITE TO 1ST ADDR OF CHIPS A, B, C, D, & E |
| 2 | WRITE TO 2ND ADDR OF CHIPS A, B, C, D, & E | WRITE TO 2ND ADDR OF CHIPS A, B, C, D, & E |
| 3 | WRITE TO 3RD ADDR OF CHIPS A, B, C, D, & E | WRITE TO 3RD ADDR OF CHIPS A, B, C, D, & E |
| 4 | WRITE TO 4TH ADDR OF CHIPS A, B, C, D, & E | WRITE TO 4TH ADDR OF CHIPS A, B, C, D, & E |
| 5 | READ FROM 1ST ADDR OF CHIP A | READ FROM 1ST ADDR OF CHIPS A, B, C, D, & E |
| 6 | READ FROM 2ND ADDR OF CHIP A | READ FROM 2ND ADDR OF CHIPS A, B, C, D, & E |
| 7 | READ FROM 3RD ADDR OF CHIP A | READ FROM 3RD ADDR OF CHIPS A, B, C, D, & E |
| 8 | READ FROM 4TH ADDR OF CHIP A | READ FROM 4TH ADDR OF CHIPS A, B, C, D, & E |
| 9 | READ FROM 1ST ADDR OF CHIP B | READ FAIL FLAG FROM A |
| 10 | READ FROM 2ND ADDR OF CHIP B | READ FAIL FLAG FROM B |
| 11 | READ FROM 3RD ADDR OF CHIP B | READ FAIL FLAG FROM C |
| 12 | READ FROM 4TH ADDR OF CHIP B | READ FAIL FLAG FROM D |
| 13 | READ FROM 1ST ADDR OF CHIP C | READ FAIL FLAG FROM E |
| 14 | READ FROM 2ND ADDR OF CHIP C | |
| 15 | READ FROM 3RD ADDR OF CHIP C | |
| 16 | READ FROM 4TH ADDR OF CHIP C | |
| 17 | READ FROM 1ST ADDR OF CHIP D | |
| 18 | READ FROM 2ND ADDR OF CHIP D | |
| 19 | READ FROM 3RD ADDR OF CHIP D | |
| 20 | READ FROM 4TH ADDR OF CHIP D | |
| 21 | READ FROM 1ST ADDR OF CHIP E | |
| 22 | READ FROM 2ND ADDR OF CHIP E | |
| 23 | READ FROM 3RD ADDR OF CHIP E | |
| 24 | READ FROM 4TH ADDR OF CHIP E | |

FIG. 5

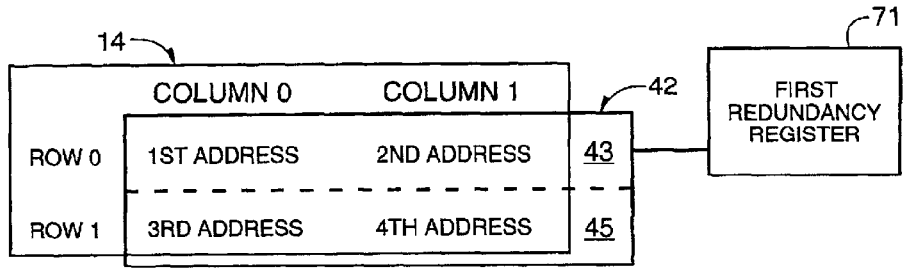
FIG. 7
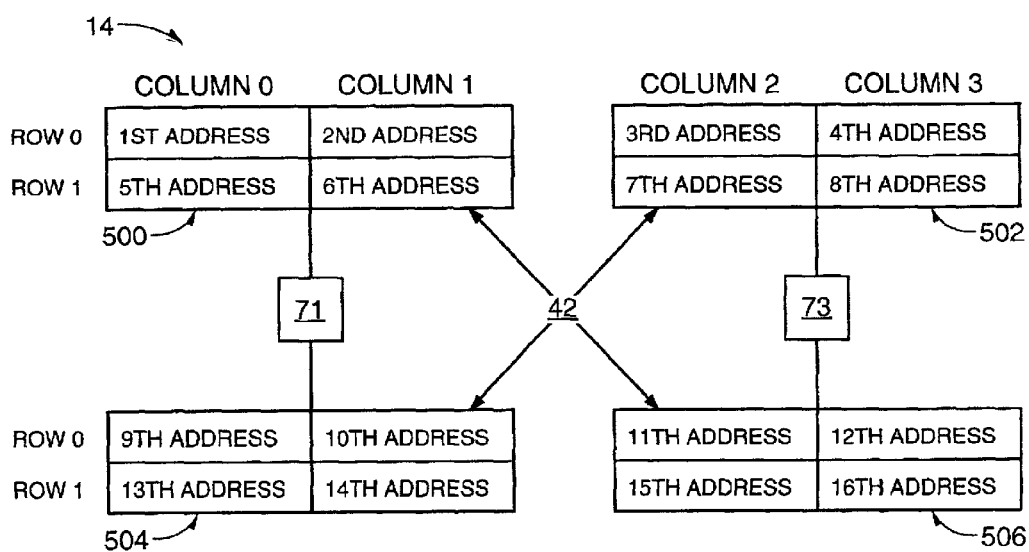
FIG. 9A
FIG. 9B

PRIOR ART REPAIR METHOD

| ADDRESS | CMD | DQ |
|---|---|---|
| 1ST ADDR TO A | BLOW 1ST FUSE | 1 |
| 2ND ADDR TO A | BLOW 2ND FUSE | 0 |
| 3RD ADDR TO A | BLOW 3RD FUSE | 0 |
| 4TH ADDR TO A | BLOW 4TH FUSE | 0 |
| 1ST ADDR TO B | BLOW 1ST FUSE | 0 |
| 2ND ADDR TO B | BLOW 2ND FUSE | 1 |
| 3RD ADDR TO B | BLOW 3RD FUSE | 0 |
| 4TH ADDR TO B | BLOW 4TH FUSE | 0 |
| 1ST ADDR TO C | BLOW 1ST FUSE | 0 |
| 2ND ADDR TO C | BLOW 2ND FUSE | 0 |
| 3RD ADDR TO C | BLOW 3RD FUSE | 0 |
| 4TH ADDR TO C | BLOW 4TH FUSE | 0 |
| 1ST ADDR TO D | BLOW 1ST FUSE | 0 |
| 2ND ADDR TO D | BLOW 2ND FUSE | 0 |
| 3RD ADDR TO D | BLOW 3RD FUSE | 0 |
| 4TH ADDR TO D | BLOW 4TH FUSE | 0 |

FIG. 8A
(PRIOR ART)

EXEMPLARY REPAIR METHOD

| ADDRESS | CMD | DQ |
|---|---|---|
| COL 0 TO A-D | BLOW FUSE | DO NOT CARE |
| COL 1 TO A-D | BLOW FUSE | DO NOT CARE |

FIG. 8B

CIRCUIT AND METHOD FOR TIME-EFFICIENT MEMORY REPAIR

RELATED APPLICATIONS

This application is a continuation-in-part of U.S. application Ser. No. 09/810,366, filed on Mar. 15, 2001.

TECHNICAL FIELD

The present invention relates generally to the computer memory field and, more specifically, to test and repair of memory.

BACKGROUND OF THE INVENTION

A memory device is often produced using a semiconductor fabrication process. In the current application, the term "semiconductor" will be understood to mean any semiconductor material, including but not limited to bulk semiconductive materials (either alone or in assemblies comprising other materials thereon), and semiconductive material layers (either alone or in assemblies comprising other materials). Moreover, it shall be understood that a semiconductor device may comprise conductive and insulative materials as well as a semiconductive material. The result of a semiconductor process may be a die comprising memory circuitry, and it may be desirable to test that circuitry at some point during the process of constructing a memory device comprising that die. For instance, testing may occur while the die is part of a semiconductor wafer, after singulation from the wafer, during die packaging, or once the memory device (chip) is completed.

One conventional method of testing such a chip is to have an external testing device write data to every memory cell of the chip, then read data from every memory cell, and compare the input with the output. Such a comparison may reveal cells that failed to store the data properly. The addresses corresponding to these defective cells can be stored by the external testing device, and that stored data may be used to repair the chip. In order to effect such repair, redundant cells are provided on the chip, as well as at least one bank of programmable elements, such as fuses or anti-fuses, that controls access to the redundant cells. Assuming the bank to be comprised of anti-fuses, repair circuitry receives each address corresponding to a defective cell and, based on that address, blows at least one anti-fuse, thereby isolating the defective cell and associating the address with a redundant cell.

This error detect and repair scheme, however, raises issues. One such issue is the number of chips that may be tested at one time. A typical testing device is an AMBYX machine. The AMBYX can hold 256 chips and may electrically connect to all of them. Hence, the AMBYX can write to all chips in parallel. However, the AMBYX cannot read potentially differing data from all 256 chip in parallel. Rather, it has limited resources concerning reading data from the chips. Specifically, the AMBYX has only 64 terminals (known as "DQ's") for reading from the chips. As a result, the 256 chips must share these DQ resources. Assuming each chip has only four DQ's of its own (in which case the chips would be known as a "x4" part), then the AMBYX could access only 16 chips at one time. Thus a typical testing process would involve writing data to cells of 16 chips; reading data from cells of all 16 chips; comparing the written data with the read data; and, for cells wherein the written data and read data do not match, storing the addresses of those failed cells. These steps must be performed 15 more times in order to test all 256 chips on the AMBYX. Moreover, once repaired, the chips are often retested in a second test cycle to determine whether the repair was successful, thereby requiring even more time, especially if the chips must be removed from the AMBYX for repair and then placed back onto the AMBYX for retesting. Further, more than one type of test is often conducted. As a result, there is a desire in the art to shorten test time.

Still other issues include the time and circuitry used to repair the chips. First, as mentioned above, the machine used to repair the chips may be different from the machine used to test the chips. Thus, it is often the case that the chips must be removed from the AMBYX and placed in another device, such as one made by TERADYNE, thereby undesirably adding time and effort. Further, maintaining the assumption (only for purposes of example) that completely packaged parts are being repaired, it can be understood that at least some of the redundant elements provided on a chip's die may have been used as a result of prior testing and repair processes, possibly including those accomplished at some stage prior to complete packaging. Thus, in repairing packaged parts, a testing or repair device may examine the chips to determine whether there are still redundant elements available for repair. If there are, the location of the elements is stored in registers within the testing device, and repair commences. Repair often involves transmitting in parallel the first address to the address inputs of one chip, transmitting a command to blow an anti-fuse on each chip that would reroute signals pertinent to that address to a redundant cell, and transmitting through the DQ lines a command to ignore the blow command if the first address does not match a failed address stored within the repair device's registers. This process is subsequently performed for the chip's second address, then the third address, etc., until all of the addresses have been accommodated. Then the process is repeated for the next chip. The serial nature of this repair scheme is very time consuming, and, as with the testing process, there is a desire in the art to reduce the time used for repair. Built In Self Repair (BISR) techniques may be used to affect test time, but often this is accomplished at the cost of the amount of die size needed to allot to on-chip registers and repair logic.

Moreover, neither alternative addresses the timing for the signals needed to blow the anti-fuses. In prior art, the appropriate signals must be transmitted to the chips for a certain amount of time to ensure that the anti-fuses will blow. Once that time has elapsed, the signals are changed to accommodate the next address. It is desirable to shorten repair time, but early reconfiguration of the signals to accommodate the next address risks an incomplete blow of the first anti-fuse and thereby may result in a failure to repair the chip. As a result, there is a need in the art for repair circuitry and methods that affect the time required to repair the chips while avoiding a great increase in die size and avoiding a great risk of an incomplete repair.

SUMMARY OF THE INVENTION

Accordingly, exemplary embodiments of the current invention provide methods and circuitry for testing and repairing a chip. In one exemplary embodiment, data stored on a chip's memory is read to the extent that it is accessed from the memory array. However, rather than transmit the data to an external testing device, the chip's output circuitry is tri-stated, the external testing device transmits to the chip the data that is expected to be stored, and a comparison between the stored data and the expect data occurs on chip.

Another embodiment concerns storing a result of a test in an on-chip address register, regardless of whether that test is one described above or another. In a preferred embodiment, at most one failed address is stored, along with a bit indicating that a failure has been found. In a more preferred embodiment, the stored address is the last failed address resulting from the test; and only the column address, rather than both the column and row address, is stored. In another embodiment, the address register of a failed part is cleared after testing, and further testing commences. If such testing reveals a failed address already associated with a redundant cell, that address is not stored, although a bit indicating that a failure has been found is stored.

In yet another embodiment, chip repair is carried out wherein, given a defective memory cell, an entire group of memory cells including the defective cell is replaced by a redundant group of cells. In a preferred embodiment of this type, an entire column of redundant memory cells replaces a column of memory cells containing the defective cell. In a more preferred embodiment, the address of the defective memory cell is stored in an on-chip register. In an even more preferred embodiment, only one column—the column including the last recorded failed memory cell—is replaced as a result of one test cycle. In many embodiments, the location of available redundant cells that will allow replacing the entire column is stored in at least one on-chip redundancy register. Preferably, the redundancy register stores only a column address corresponding to an available redundant column of cells. Still more preferably, the redundancy register stores only a column address corresponding to the available redundant column of cells found last in a search, discarding earlier column addresses for later-found ones.

Still other embodiments allow signals having a first configuration directed to blowing a first anti-fuse to be switched to a second configuration directed to blowing a second anti-fuse, wherein the switch is performed before the time sufficient to blow the first anti-fuse. Nevertheless, the relevant signal is still transmitted to the circuitry of the first anti-fuse for a time sufficient for blowing. In a preferred embodiment, this is accomplished by making the effect of changes in an input signal synchronous with a modified clock signal. In a preferred embodiment of this type, the signals that blow anti-fuses allow for chip repair as summarized above.

These and other embodiments within the scope of the invention include within the scope both apparatuses and methods; and still other embodiments encompass combinations of the embodiments listed above.

BRIEF DESCRIPTION OF THE DRAWINGS

FIG. 2 is a table comparing a test method known in the art with an exemplary method within the scope of the current invention.

FIG. 4 is a table comparing a second test method known in the art with a second exemplary method within the scope of the current invention.

FIG. 5 is a table comparing a third test method known in the art with a third exemplary method within the scope of the current invention.

FIG. 7 is a chart illustrating hypothetical memory chip test results.

FIGS. 8A and 8B are tables comparing a prior art repair method with an exemplary repair method within the scope of the current invention.

FIGS. 9A and 9B depict portions of circuitry addressed by exemplary embodiments of the current invention.

DETAILED DESCRIPTION OF THE PREFERRED EMBODIMENTS

Exemplary embodiments of the current invention address methods and circuitry for detecting errors, repairing errors, or both.

I. Error Detection

Figure 1:
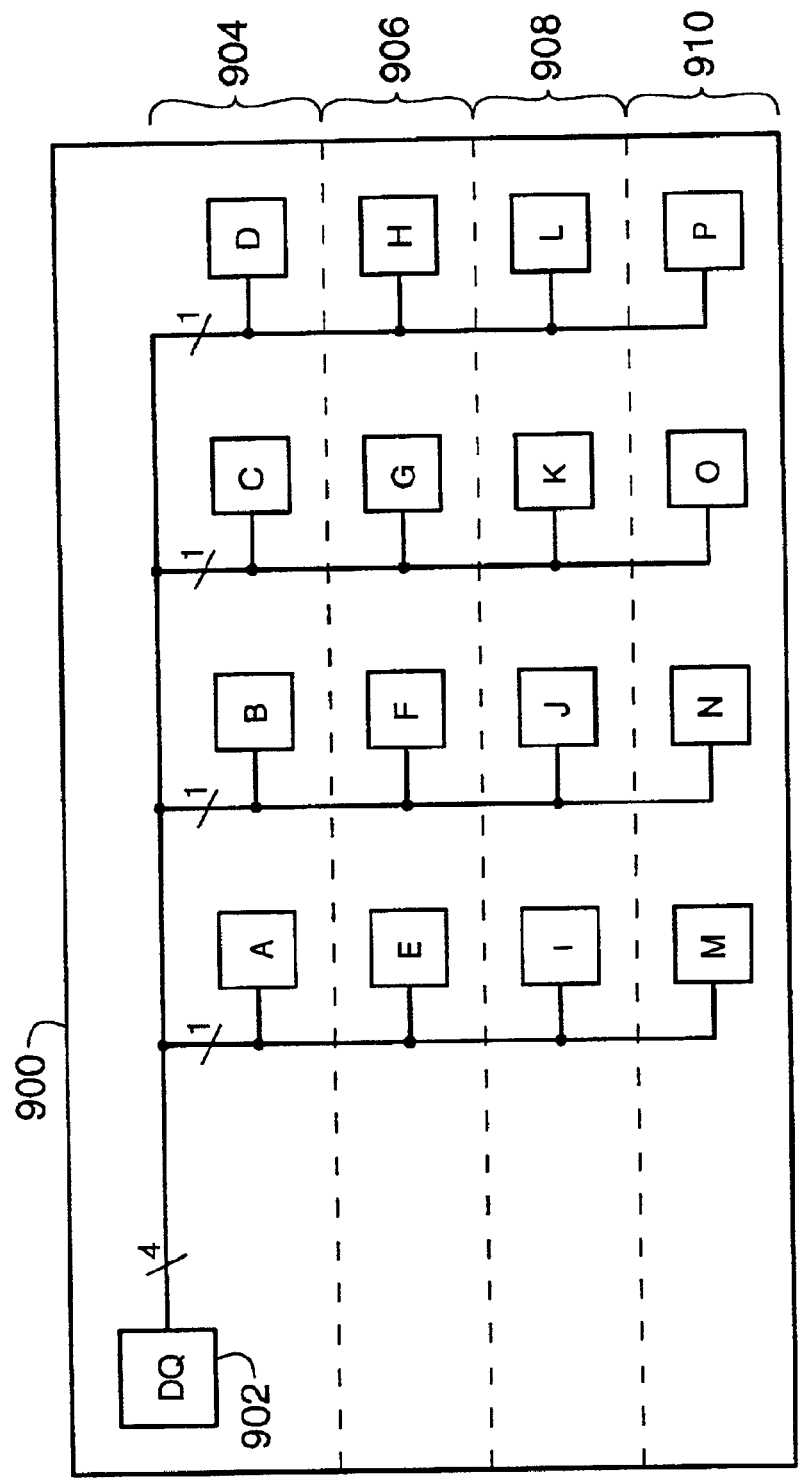
FIG. 1 depicts a prior art testing device for a plurality of chips.

In terms of error detection, exemplary embodiments of the current invention shorten test time by presenting a testing scheme alternative to the one presented in the Background. To begin with, a simplified test method practiced in the prior art is presented. FIG. 1 presents a portion of a simplified tester 900 having only four DQ's 902. While the tester 900 may be able to physically hold 16 chips (A–P), its circuitry is designed to receive signals from at most four chips at one time. It is understood that the tester 900 also has conductive lines (not shown) that carry address and command information to the chips, and that these lines are also limited in number and so can receive signals from at most four chips at a time. The areas in which the tester may communicate in such a fashion are identified in this specification as "regions." Tester 900 has four regions 904, 906, 908, and 910. Further, it is assumed for purposes of explanation that the parts A–P are "x1" parts (each having only one DQ) and have only four memory addresses.

The prior art commands for one exemplary test using tester 900 are depicted in the left-hand column of the table in FIG. 2. During the first clock cycle, the same bit is written to a cell corresponding to the first address in each of chips A–D. Because the same bit is being written, the write step may occur in parallel with respect to chips A–D. Similar parallel writing steps may be taken to write to the second, third, and fourth addresses of chips A–D. As a result, writing to every address of all four chips requires 4 clock cycles. However, reading from the chips A–D for purposes of off-chip comparison with expected data may not be performed in parallel, as the chips may not output identical data due to chip failures which this test seeks to reveal. As a result, the tester must read from each address in each chip in series. FIG. 2 indicates that reading from all four addresses of chip A requires four clock cycles (5–8). In fact, four clock cycles are required to read from all addresses of each chip, resulting in a total of twenty clock cycles needed to test the four chips 20 in this one region 904 of the tester 900. An additional 20 clock cycles is then needed for each of the remaining regions 906, 908, 910. Thus in this example, test time takes 80 clock cycles, and that amount is just for one test. Generally several tests are performed on the chips, with each test requiring 80 clock cycles. Moreover, chips that failed a test the first time often repeat that test after being repaired, thereby requiring even more test time. One can now appreciate the degree to which the required test time can multiply.

Figure 3:
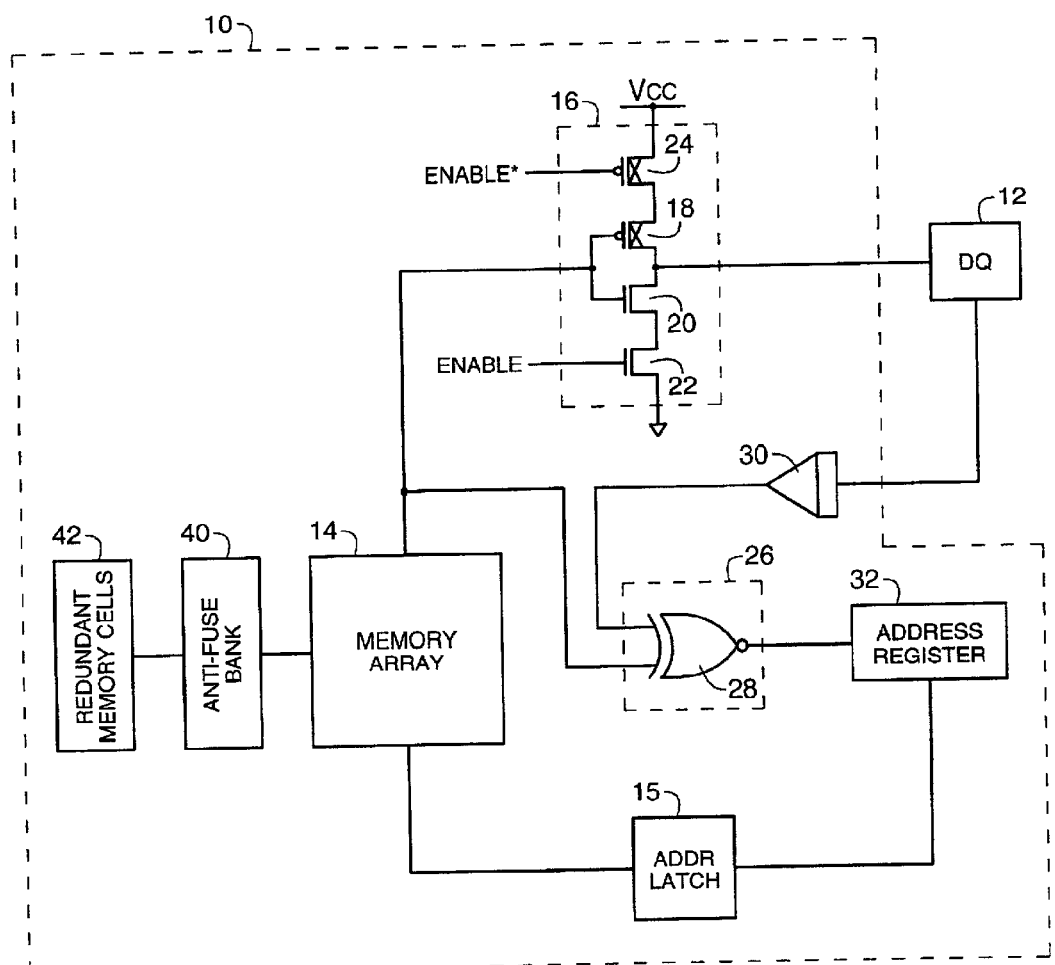
FIG. 3 illustrates circuitry of an exemplary apparatus embodiment within the scope of the current invention.

At least one exemplary embodiment of the current invention affects the time required to perform such a test. Such an embodiment is depicted in FIG. 3, which illustrates circuitry included as part of a chip 10, and a DQ 12 of a tester. Chip 10 includes a memory array 14 comprising main or primary memory cells; an address latch 15 that is configured to transmit a memory address (and may further comprise a separate row address latch and column address latch); an anti-fuse bank 40 which, based on its programming state, may divert a signal for a cell in the memory array to one in a bank of redundant memory cells 42; and output circuitry 16. The output circuitry 16 is connected to the memory array 14 and the DQ 12. Output circuitry 16 comprises four transistors 18, 20, 22, and 24. The gates of p-channel transistor 18 and n-channel transistor 20 are connected to each other and to the memory array 14. Their drains are also connected to each other and to DQ 12. N-channel transistor 22 is coupled to ground and to transistor 20 and is driven by a signal ENABLE. A complementary signal ENABLE* drives transistor 24, which is coupled to a voltage source Vcc and to transistor 18.

In a standard read operation, the ENABLE signal represents a high voltage signal that turns on transistor 22. Accordingly, the ENABLE* signal represents a low voltage signal that turns on transistor 24. A data value from at least one cell in memory array 14 (designated by the address in the address latch 15) is transmitted to the gates of transistors 18 and 20, and an inverted signal is output from their drains to the DQ 12. However, in a test mode under an exemplary embodiment of the current invention, ENABLE is at low voltage. As a result, transistor 22 turns off (isolating the output circuitry 16 from ground), ENABLE* is at a high voltage, and transistor 24 turns off (isolating the output circuitry 16 from Vcc). The state of the output circuitry 16 in this mode is known as a "tri-state." The data value from memory cell 14 nevertheless transmits to an on-chip comparison circuit 26, which, in this example, is an exclusive NOR gate 28 that receives both the data from the memory array 14 and the data transmitted from the tester's DQ 12 (it is preferred, although not required, that the signal from DQ 12 first pass through an input buffer 30). Although the output circuitry 16 has been tri-stated and data is being transmitted to the chip 10 through the DQ 12, the chip 10 is considered to be in a "read" mode given that the data stored on chip 10 is being accessed. Based on the truth table for an EXCLUSIVE NOR operation, the EXCLUSIVE NOR gate 28 will output a low voltage signal only when both inputs fail to match, thereby indicating a defect in the cell corresponding to the memory address. The low voltage output from the EXCLUSIVE NOR gate prompts a storage device such as address register 32 to store the memory address transmitted by the address latch 15. Moreover, it is also preferable (although not required) for purposes of further testing as discussed below that the address register 32 also store a bit that indicates whether an error has been found. For purposes of explaining other exemplary embodiments of the current invention, this bit will be referred to as the "fail flag."

The right column of FIG. 2 illustrates that using the circuitry described above allows for an exemplary method of testing chips A–P on FIG. 1's tester 900 with fewer steps than was used in the prior art. As in the prior art, a particular bit may be written to every chip in a region in a parallel manner. Thus, writing to the first address of chips A–D can be performed in the same clock cycle, as can writing to the second, third, and fourth addresses. While writing to chips A–D takes the same number of clock cycles as in the prior art, the savings in this exemplary testing method appear when the chips enter their "read" mode.

Unlike the prior art test, the tester's DQ's 902 are not needed to serially transmit possibly differing data from chips A–D. This is because analysis of the chips' stored data occurs within each chip. Thus, the tester's DQ's 902 may now be used to transmit to chips A–D the data that is expected to be stored in the first address on those chips. Because the data written to the first address is the same for chips A–D, the expected data is also the same, and that expected data may be therefore transmitted by the tester in a parallel fashion. As a result, only one clock cycle is used to test the first address in chips A–D. A mismatch between the expected data and the data read from the first address of any of the chips A–D suggests a defective memory cell. In that event, the first address of the relevant chip would be stored in its address register 32 along with data—such as the fail flag—indicating that at least one error has been found on that chip.

Subsequently, the second address of chips A–D is read during the next clock cycle and compared with the expected data, and so on for the third and fourth addresses, with the failed addresses being stored in the appropriate address register 32 accordingly. As a result, this exemplary testing method accomplishes in eight clock cycles what it took the prior art twenty clock cycles to accomplish. Even after adding the preferred steps of serially reading for the fail flag that could result from the on-Micron chip comparisons, clock cycle savings are still realized in comparison to the prior art method. It is further preferred that the circuit in FIG. 3 and process of FIG. 2 be implemented with chips that exhibit a latency of 1 or 2, wherein latency indicates the delay in the number of clock cycles between the arrival of a "read" command and the availability of data to be read. Nevertheless, it should be understood that the current invention includes within its scope exemplary embodiments implemented with chips that exhibit other latencies and that include any extra logic circuitry to accommodate those latencies.

Moreover, it should be remembered that the example is a relatively simple one, with each chip having only four addresses and the tester 900 being able to test only four chips at once. As discussed in the background section, it is not unusual to test chips having millions of addresses per chip and to test them sixteen at a time. The savings offered by the exemplary method embodiment disclosed above become even greater with added complexity of the test scheme.

For instance, assuming that chips A–P had five addresses rather than four, the table in FIG. 4 illustrates that the prior art test of region 904 would require five additional clock cycles: one clock cycle for a parallel write command to the fifth address of chips A–D; and four clock cycles, each needed to read from the fifth address of each chip A–D. In contrast, the exemplary method could use only two additional clock cycles: one clock cycle for a parallel write command and one clock cycle for a parallel read command.

Another example illustrated in the table of FIG. 5 assumes that five chips (each having four addresses) could be tested in parallel rather than four chips. The prior art method would require four more clock cycles to read from the four addresses of that extra part, whereas the exemplary method would require only one extra clock cycle to read the fail flag from the extra part; reading from all addresses of chip E requires no additional clock cycles, as that can be performed in the same clock cycle for reading from the other chips.

As a result, one can now appreciate that an increase in the chips per region, the number of regions, the number of tests, or the number of bits per chip results in a multiplied amount of clock cycle savings during testing using exemplary embodiments of the current invention. Such savings can result in shorter test time or allow more time for other tests. In fact, testing directed by the inventor using exemplary embodiments of the current invention has demonstrated a reduction in test time by 45%.

The preferred number of failed address to be stored in address register 32 can be based on balancing the desire to fabricate as small a chip as possible with the desire to increase the likelihood of being able to keep track of all addresses corresponding to defective cells after one test cycle. The greater amount of on-chip test circuitry (including a large register capable of storing many failed addresses and the supporting logic circuitry), the more likely it is to ensure such ability. The cost, however, is that a great amount of die space may be devoted to that. Conversely, a lesser amount of on-chip test circuitry (including a register capable of storing few failed addresses and less supporting logic circuitry) allows for less die space to be devoted at the cost of some ability to keep track of all failed addresses after one test cycle. Such a balancing has been made concerning Synchronous Dynamic Random Access Memory (SDRAM) parts recently fabricated by Micron Technology, Inc., including part numbers MT48LC32M4A2 (an 8 Meg×4×4 bank part), MT48LC16M8A2 (a 4 Meg×8×4 bank part), MT48LC8M16A2 (a 2 Meg×16×4 bank part), and MT48LC4M32B2 (a 1 Meg×32×4 bank part). These parts incorporate many of the exemplary embodiments of the current invention. An analysis of the failed cells found on these parts during testing revealed that 90% of the failed chips can be fully repaired by replacing only one column containing at least one defective cell with a redundant column. As a result, these parts have a register that stores only a single failed address at one time (preferably in addition to the fail flag), and that address is only the column address, without the row address. Accordingly, a relatively small failed address register and related logic circuitry is provided on-chip. Further, it is preferred that the register store the latest failed address, clearing any former address that may have been stored.

After the test, the chips containing defective cells may be repaired. Such chips will be identified by the presence of the fail flag value in the address register 32 of relevant chips. Chips without the fail flag may bypass the repair process, thereby allowing the limited resources of the repair device to be devoted to the chips that need repair.

Once the chips have been repaired, they may undergo a repeat of the previous test. Alternatively, they and the chips that passed the previous test may be subjected to a different test. In such cases, the address and fail-flag value may be cleared from the repaired chips' address registers 32 before testing continues, and the testing process proceeds as described above. Further testing may reveal a defect concerning an address wherein the originally associated column of cells has already been isolated in favor of a redundant column as a result of a prior repair. In some exemplary embodiments of the current invention, it is not desirable to include circuitry designed to isolate a one redundant column in favor of a second. Thus, although not required in every embodiment of the current invention, it is preferable in certain exemplary embodiments to avoid storing a failed address in address register 32 if that address is already associated with a redundant cell. The status of the anti-fuses in the anti-fuse bank 40 can be used to determine if such is the case. If such a failure occurs, however, it is desirable to record the existence of the failure by storing the fail flag in address register 32. Thus, if at the end of a test, the address register 32 stores a fail flag with no address, that is an indication that a redundant cell has failed, and the chip may be handled accordingly.

II. Error Repair

In terms of error repair, exemplary embodiments of the current invention present repair schemes alternative to the ones disclosed in the prior art. In the prior art, for instance, repair may occur by placing the chips in a repair device, such as a TERADYNE machine, wherein the TERADYNE has stored within its registers the failed addresses as well as the location of available redundant elements of each chip. Repairing is then performed on a plurality of chips such as the chip 50 depicted in FIG. 6. On that chip 50, anti-fuse logic 52 is coupled to an anti-fuse bank 40 comprising anti-fuse circuits such as anti-fuse circuits 54, 54', 54" and 54'". Anti-fuse circuit 54 comprises a capacitor (the anti-fuse 56) having one plate coupled to a voltage CGND (which may also be known as Vpop, and in this example is 9 volts), while the opposing plate is coupled to ground through transistor 58. Transistor 58 is driven by a signal from anti-fuse logic 52. Anti-fuse circuits 54', 54", and 54'" are configured similarly, but their analogous transistors may be driven by unique signals from the anti-fuse logic 52. The driving signals from the anti-fuse logic 52 are, in turn, determined by the control signals input from the TERADYNE. The address input ADDR 60 determines which address may be isolated from its original memory cell and associated with a redundant cell. The CMD input 62 carries the command to chip 50 to blow an anti-fuse. The state of the DQ input 64 determines whether a particular chip will ignore the CMD input 62. These signals are logically related by anti-fuse logic 52 to determine whether transistor 58 and/or its analogs in other anti-fuse circuits 54', 54", etc., are to be driven. The anti-fuse logic also receives a clock input CLK 66, which may be a pulsed signal transmitted at a regular interval or period. Changes in the address input ADDR 60 and DQ input 64 result in a change of output signals that determine which if any of the anti-fuse circuits 54, 54', 54", or 54'" are driven.

Before transistor 58 is driven, the insulation between the electrodes of anti-fuse 56 blocks a conductive path from CGND to node 68. Once transistor 58 is driven, the voltage difference between CGND and ground begins to break down the dielectric of anti-fuse 56. If transistor 58 is driven for 2 milliseconds, then the dielectric breaks down sufficiently enough to form a permanent conductive path between CGND and node 68, and the anti-fuse 56 is considered blown. Once anti-fuse logic 52 stops driving transistor 58, then node 68 is isolated from ground, and CGND may affect other circuitry coupled to node 68 such that a particular address may become associated with a redundant memory cell and isolated from a main memory cell.

The information concerning available redundant elements on each chip results from checking the status of the anti-fuses used to access them. Thus, circuitry connected to node 68 could be used to determine whether the voltage source CGND is still isolated from node 68. If such isolation exists, then capacitor 136 has not been blown, and the fact that the related redundant cell remains available is recorded by the repair device. Analogous to cells in the main memory array 14, cells in the redundant memory array 42 have their own row and column addresses, and one method of storing the fact that a related redundant cell remains available is to store its redundant row and column address. Prior art teaches repeating this procedure for each redundant element.

It is assumed that blowing anti-fuse 56 of circuit 54 of any of the chips A–D would reroute a signal related to the first address from a main memory cell to a redundant memory cell. It is also assumed that blowing the anti-fuse 56' of circuit 54' would reroute a signal related to the second address of any of the chips A–D. For chip A, it is further assumed that the anti-fuse 56 remains unblown; and the availability of anti-fuse 56 for repair of chip A is stored on the repair device. For chip B, it is assumed that the anti-fuse 56' is configured to repair the second address and remains unblown. The availability of anti-fuse 56' for repair of chip B is also stored on the repair device.

In repairing four chips A–D (each with four addresses, a single DQ, and a configuration such as that of chip 50 in FIG. 6), the assumed test results for purposes of explanation are illustrated in FIG. 7. Specifically, it is assumed that the memory cell corresponding to the first address of chip A failed testing (indicated by the "F"), with the three cells corresponding to chip A's other three addresses passing the test (indicated by the "P"). Chip B, on the other hand, was found to have a defective cell corresponding to the second address, while the cells corresponding to the first, third and fourth addresses passed. All cells of chips C and D passed.

As a result, when prior art repair techniques begin, the TERADYNE transmits the instructions illustrated in the table of FIG. 8A. The table in FIG. 8A indicates that instructions may be transmitted to at least the address input ADDR 60, the command input CMD 62, and the DQ input 64 illustrated in the circuitry of FIG. 6. The first set of instructions includes (1) the first address, which is transmitted through the address input ADDR 60 to chip A; (2) the command to blow the anti-fuse associated with the first address, which is transmitted along the CMD 62 input; and (3) the instruction to allow the blow anti-fuse command, which is transmitted by a high voltage signal through the DQ line 64 to chip A. Once these commands are present for the required amount of time, anti-fuse 56 of chip A will blow, thereby associating the first address with a redundant cell. The next set of instructions are directed to the second address of chip A. Hence, the second address is transmitted through the address input ADDR 60 to chip A; the command to blow the fuse associated with the second address is transmitted along the CMD 62 input; but, because the cell corresponding to the second address passed its test, an instruction to ignore the blow fuse command is transmitted by a low voltage signal through the DQ input 64 to chip A. Transmissions of analogous instructions concerning the other addresses of chip A, as well as the addresses of chips B–D, follow in series.

At least some of the exemplary embodiments of the current invention provide alternative repair circuits and methods. Methods and circuits concerning the number and relationship of elements used in repair and/or recording the availability of redundant elements are addressed under the heading of "Smart Repair." Methods and circuits concerning the timing of signals transmitted during repair are addressed under the topic of "Speedy Repair."

A. Smart Repair

Preferred embodiments of the current invention concerning the number and relationship of elements used in repair and/or recording the availability of redundant elements (1) involve aspects related to the notion of redundant planes; and (2) are used in conjunction with embodiments concerning error detection described in part I above.

Concerning redundant planes, it should be noted that redundant elements of a memory chip may be organized into at least one redundant plane, in addition to being organized by redundant row and column addresses. Each redundant plane may be configured to accommodate a particular portion of the total main memory. If there is only one redundant plane for a memory array, it follows that any of the plane's redundant elements is configured to replace any cell in the memory array. Doing so can involve an undesirable amount of support circuitry, however. As a result, there are often a plurality of planes devoted to the totality of the main memory cells, wherein each plane may be configured to accommodate a discrete portion of the total main memory. Returning to the example wherein chips having only four addresses are repaired, it is further assumed that the architecture of memory array 14 is like that illustrated in FIG. 9A. Specifically, the memory array 14 is arranged into two columns (column 0 and column 1) and two rows (row 0 and row 1), wherein the first address and the third address are in the same column, and the second and fourth addresses also have a common column address. It is further assumed that the array of redundant memory cells 42 is divided into two planes, wherein redundant cells of the first plane 43 are configured to accommodate only the first or second addresses, and redundant cells of the second plane 45 are configured to accommodate only the third and fourth addresses. It is also noteworthy that multiple redundant planes are used to accommodate the entirety of a particular column. It is also noteworthy that redundant cells having a common redundant column address may be organized into different planes.

Regarding embodiments concerning error detection, it should be remembered that, in preferred embodiments of that type, an on-chip address register 32 is provided and configured to store the column portion (and not the row portion) of the main memory address of the last failed cell found, as well as a fail flag. This is done because it is preferred to replace an entire column's-worth of cells. Hence, in preparation for repair, it is desired to identify a column's-worth of redundant cells in the redundant array. It is even more preferable to identify a group of available redundant cells sharing the same column address in the redundant array. If such a redundant column is found, one may store only the column address of the redundant column rather than storing the redundant row addresses as well. Such storage is preferably accomplished with a storage device such as a redundancy register 71 (FIG. 9A). In a manner analogous to the preferred operation of the address register 32, the redundancy register 71 stores only one redundant column address, with an earlier-found redundant column address being cleared from the register in favor of a later-found redundant column address. In an even more preferable embodiment, the redundancy register is on chip.

Moreover, if the redundancy register stores data pertinent to an entire column of redundant cells, and the entire column of redundant cells is split between a plurality of redundant planes, it follows that one redundancy register may contain data relevant to more than one redundant plane. Thus, in the exemplary circuitry of FIG. 9A, there is a first redundancy register 71 configured to store a redundant column address that may be relevant to at least one cell in redundant plane 43 and at least one cell in redundant plane 45.

Figure 10:
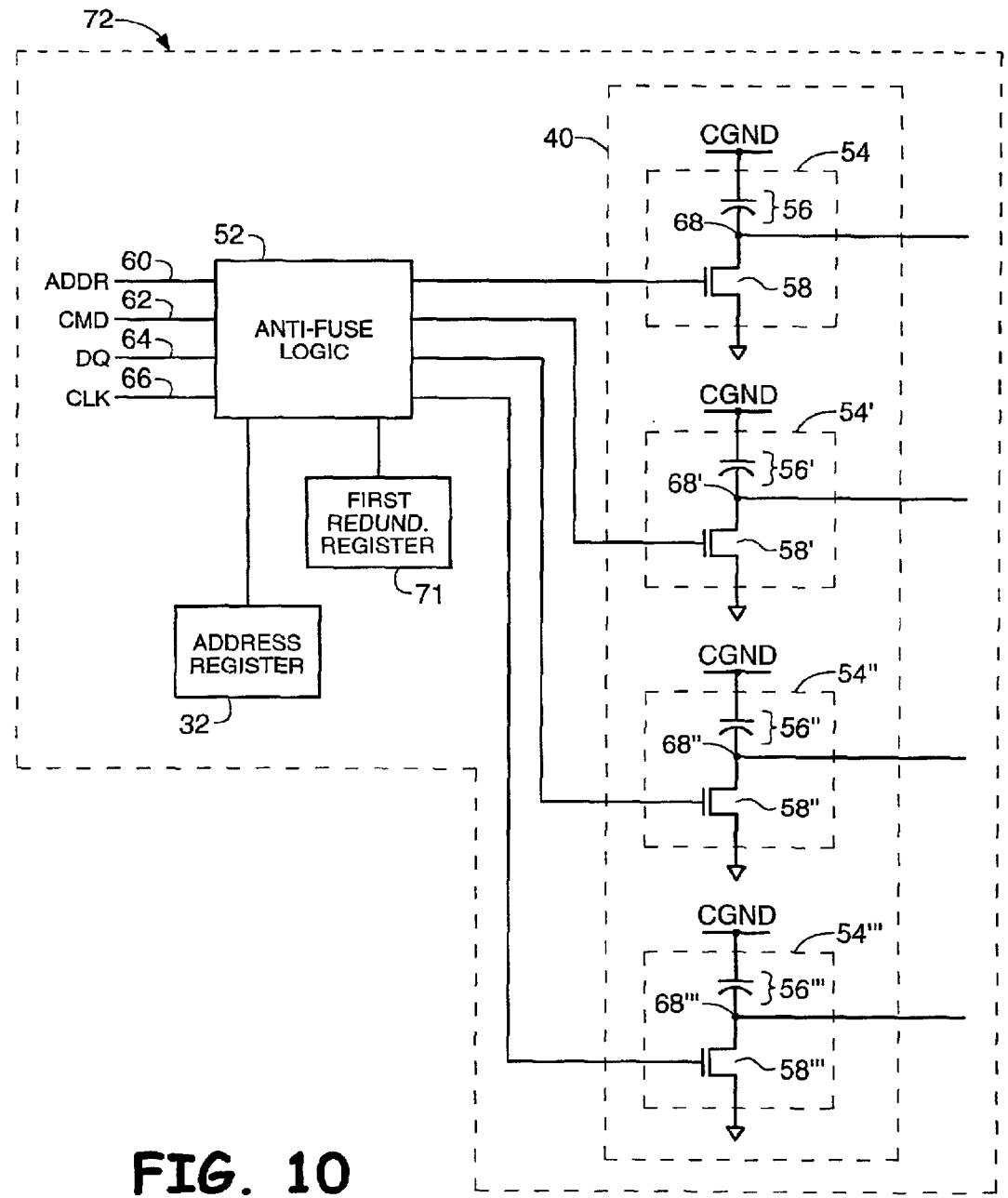
FIG. 10 illustrates another portion of circuitry addressed by an exemplary embodiment of the current invention.

An illustration of the preferred "Smart Repair" embodiment combined with a preferred error detect embodiment is illustrated in FIG. 10, wherein the circuitry forming part of chip 72 includes address register 32, which is preferably configured to store the column address of the last failed cell found during the preceding test (and a fail flag bit if such a failure is found). The circuitry forming part of chip 72 also includes the first redundancy register 71. The first redundancy register 71 is preferably configured to store the latest known redundant column address identifying an available redundant column spanning redundant planes 43 and 45.

For purposes of illustrating repair of chips having the configuration of FIG. 10, it is once again assumed that the test results are those depicted in FIG. 7. As a result, address register 32 of chip A stores the column 0 address and a fail flag; address register 32 of chip B stores the column 1 address and a fail flag; and the address registers 32 of chips C and D are clear. It is further assumed that an available redundant column spanning planes 43 and 45 is found in chip A and that the column address of that redundant column is stored in the redundancy register 71 of chip A. It is also assumed that an available redundant column is found in chip B and that the column address of that redundant column is stored in the redundancy register 71 of chip B.

It is preferred that the repair of any chip be carried out by replacing the primary memory cells associated with the column address stored in address register 32 with redundant memory cells associated with the redundant column address stored in redundancy register 71. An exemplary set of commands for repairing the chips appears in the table in FIG. 8B. The table in FIG. 8B indicates that instructions may be transmitted to at least the address input ADDR 60, the command input CMD 62, and the DQ input 64 illustrated in the circuitry of FIG. 9. Because it is preferred to repair an entire column, the address inputs need only cycle through the column addresses, with the row addresses having a "don't care" value. Thus, the repair device first transmits the first column address to chips A–D through the address input ADDR 60 and the "blow anti-fuse" command by way of input CMD 62. Concerning the DQ input 64, it may be a "don't care" value or may be used to serve another purpose that would not be available in prior art methods. For instance, it is preferred that the DQ input 64 be used in selecting the anti-fuses to be blown.

Given these inputs, the lack of a fail flag in the registers 32 of chips C and D serves as input to their respective anti-fuse logic circuits 52 and results in ignoring the "blow fuse" command. However, the fail flag bit in the address register 32 of chip A results in a comparison within that chip's anti-fuse logic circuit 52 of the column address input at ADDR 60 and the column address stored in the address register 32. For chip A, that comparison will reveal a match. As a result, chip A's anti-fuse logic circuit 52 will cause the anti-fuses associated with the data in the redundancy register 71 to blow. In this example, two redundant elements will be accessed, one in each redundant plane 43 and 45. For instance, transistor 58 may be driven for a time sufficient to establish a conductive path from CGND to node 68 and the circuitry connected thereto; and a similar process may occur simultaneously in anti-fuse circuit 54'. Such circuitry will isolate the defective cell formerly associated with the first address and associate a redundant cell with that address. It will also isolate a fully functional cell associated with the third address and associate a redundant cell with that address. It should be noted that, while the simultaneous repair mentioned above is preferred, it is not a requirement of every embodiment of the current invention. For instance, there may be a case wherein limitations in the tester equipment result in blowing the anti-fuses in series.

Chip B also has a fail flag bit in its register and, as a result, may compare the address input at ADDR 60 with the address stored in its own register 32. The comparison, however, will not reveal a match. As a result, the command to blow a fuse will not be carried out in chip B at this point. It should now be appreciated that these functions on chips A–D may be occurring at the same time.

Next, as seen in FIG. 8B, the repair device could transmit the second column address in parallel to chips A–D through the address input ADDR 60, while the input CMD 62 gives the blow command and DQ input 64 may serve at least one of several functions discussed above. Chips C and D may once again ignore the command to blow a fuse due to the lack of a fail flag. Chip A may once again compare the new column address input at ADDR 60 with the column address stored in its register 32. This time, however, the lack of a match will result in no anti-fuse being blown. Chip B may once again compare the new column address input at ADDR 60 with the column address stored in its register 32. This time, however, there will be a match. Thus, chip B's anti-fuse logic circuit 52 will cause the anti-fuses associated with the redundant column stored in chip B's redundancy register 71 to blow. More specifically, chip B's anti-fuse logic circuit 52 will drive transistors 58" and 58'" for a time sufficient to establish a conductive path from CGND to nodes 68" and 68'" and the circuitry connected thereto. Again, two redundant elements will be accessed, preferably simultaneously (but again, simultaneity is not required), one in each redundant plane 43 and 45. Such circuitry may isolate the defective cell formerly associated with the second address of chip B and associate a redundant cell with that address. Such circuitry may also isolate the effective cell formerly associated with the fourth address of chip B and associate a redundant cell with that address. Again, these functions will occur on each chip A–D at the same time.

The overall result is that this exemplary method embodiment accomplishes in two clock cycles what took the prior art method sixteen clock cycles. Another advantage of this exemplary embodiment is that the chips need not be removed from a tester and placed into a separate repairing device. Rather, the chips may remain in a tester and use its input signals while the on-chip circuitry effects repairs. Thus, it is possible to repair chips in an AMBYX device without moving them to a TERADYNE device.

Further, once the data in redundancy register 71 of any chip is no longer needed, the redundancy register 71 may be cleared in anticipation of a subsequent search for another available redundant column.

In the exemplary embodiments of FIGS. 9A and 10, it can be said that multiple redundant planes "share" a redundant register because the information that may be stored therein is relevant to both of those planes. In these embodiments, the information may be a redundant column address, wherein at least one cell in that redundant column is at least a part of one redundant plane; and at least one other cell, also in that redundant column, is at least a part of another redundant plane.

FIG. 9B illustrates another example that helps illustrate the general preference that there should be a single redundant register for a plurality of redundant planes, wherein each redundant plane of the plurality is configured to accommodate the same column of the main memory array. In FIG. 9B, there is a memory array 14 having sixteen addresses arranged into four columns and four rows. FIG. 9B graphically illustrates that the redundant array 42 is divided into four planes 500, 502, 504, and 506, wherein each plane comprises redundant cells and is configured to replace cells associated with four particular address of the main memory array 14. Redundant plane 500, for example, is configured to provide redundancy for one part of column 0, and redundant plane 504 is configured to provide redundancy for another part of column 0. Hence it is preferred to provide a redundancy register 71 that can store the column address of a redundant column that is available to replace the cells of column 0 of main memory array 14. Redundant plane 500 is also configured to provide redundancy for one part of column 1, and redundant plane 504 is also configured to provide redundancy for another part of column 1. Given the error detect circuitry that is preferred to combine with a "Smart Repair" embodiment, only one column will be repaired during a repair mode, and the redundant column address that may be stored in redundant register 71 would be capable of accommodating either main memory column 0 or 1. As a result, there is no need for an additional redundancy register solely for main memory column 1. Rather, planes 500 and 504 may share redundancy register 71. However, redundancy register 71 may not store a redundant column address capable of accommodating either main memory column 2 or 3. Accordingly, a second redundancy register 73 is provided, and because redundant planes 502 and 506 accommodate portions of columns 2 and 3, those redundant planes 502 and 506 share second redundancy register 73. Thus, should the address register 32 store column 2 or 3 as being the column with the last found defective cell, second redundancy register 73 will indicate if there is a redundant column available for one of those main columns and, if so, which redundant column is available.

From these examples, it can be seen that, where a redundant column is divided among a plurality of redundant planes, it is preferred that there be one redundancy register that may store a column address that is common to all planes of the plurality. However, while such a characteristic is preferred, it is by no means required by every embodiment of the current invention.

It should be noted that other exemplary embodiments fall within the scope of the current invention. For example, it may be possible to have a redundancy register that stores the redundant column address of the first available redundant column found rather than the last. Alternatively, it may be preferred in certain circumstances to store some redundant column address other than the first or the last. In addition, it is not necessary that the address stored be a column address—it could be a row address. Moreover, it is not necessary that the redundancy register store data concerning an address that is common to a plurality of redundant cells. Rather, the redundancy register may store other data indicating the availability of cells unrelated by addresses. For instance, the redundancy register could store a plurality of row and column addresses. Further, it is not required by the current invention to store data indicating the availability of a plurality of cells, as it may be preferable in certain circumstances to store data indicating the availability of only a single redundant cell. It is also not necessary to store an address in the redundancy register, as other information may be stored to indicate the availability of at least one redundant cell. For example, the redundancy register may store data related to the programmable element associated with a redundant element. Furthermore, it is not required for every embodiment of the current invention that a redundancy register be shared between redundant planes, or that the concept of redundant planes be incorporated at all. Instead, the current invention includes within its scope embodiments wherein redundancy registers are provided for each redundant column, as well as embodiments wherein redundancy registers are divided among portions of the redundant array by some way other than redundant planes. Moreover it is not required to include error detection considerations in all embodiments concerning "Smart Repair." Still other embodiments include those wherein the redundancy register is not limited to being on chip.

B. Speedy Repair

Regardless of whether an exemplary embodiment of the current invention incorporates methods and circuits concerning error detection or the number and relationship of elements used in repair and/or recording the availability of redundant elements, at least some exemplary embodiments of the current invention concern the timing of signals transmitted during repair.

Figure 6:
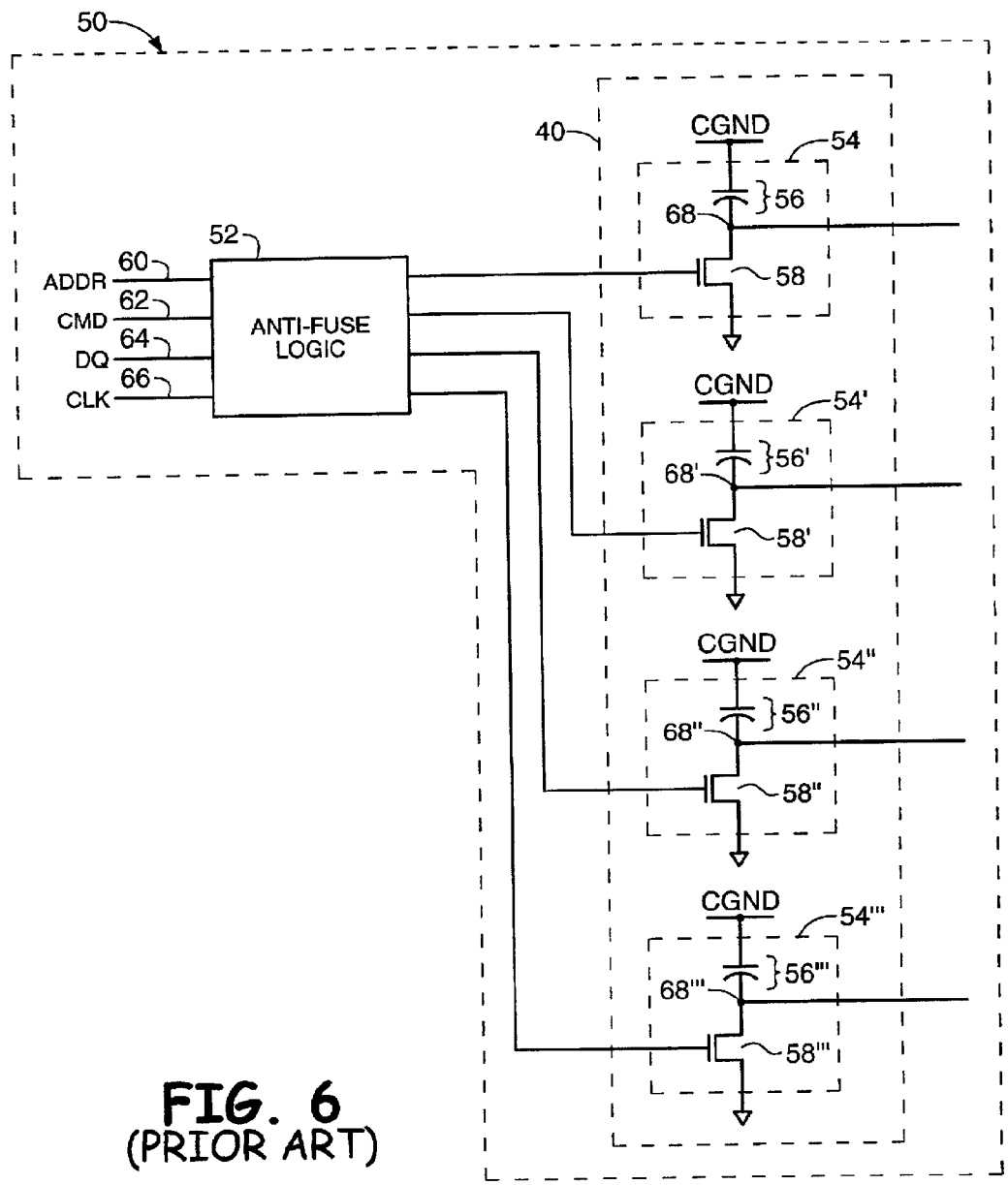
FIG. 6 illustrates prior art circuitry.
Figure 11A:
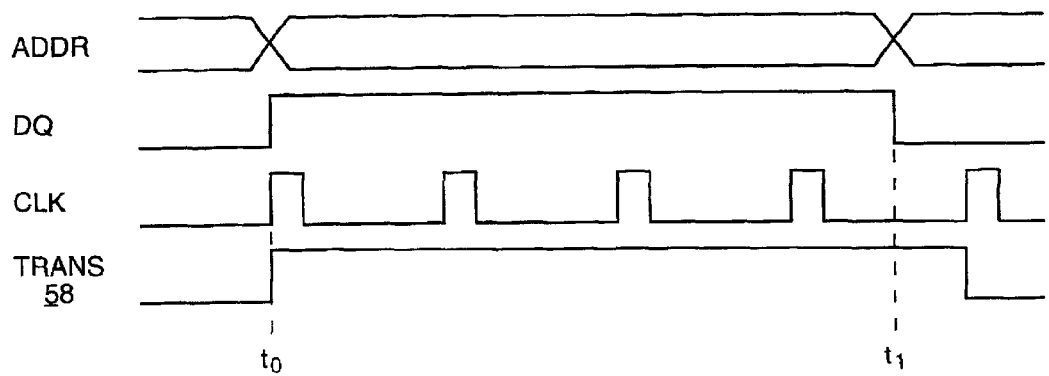
FIGS. 11A–C show timing diagrams illustrating command sequences and effects thereof in the prior art.
Figure 11B:
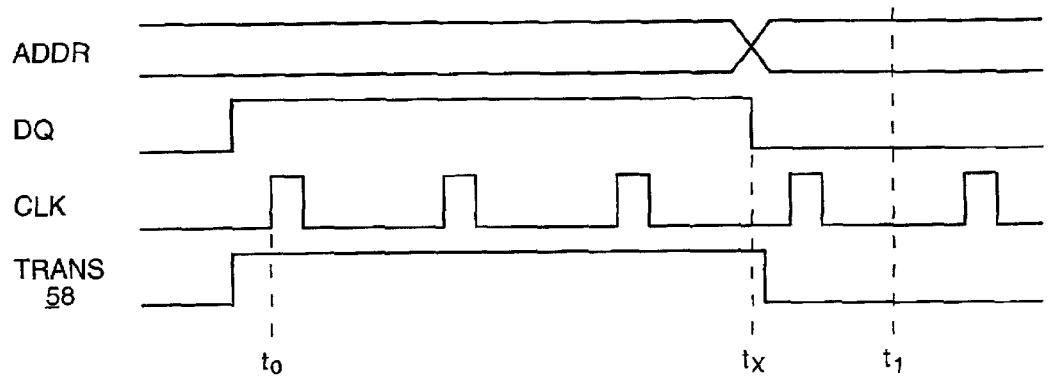
Figure 11C:
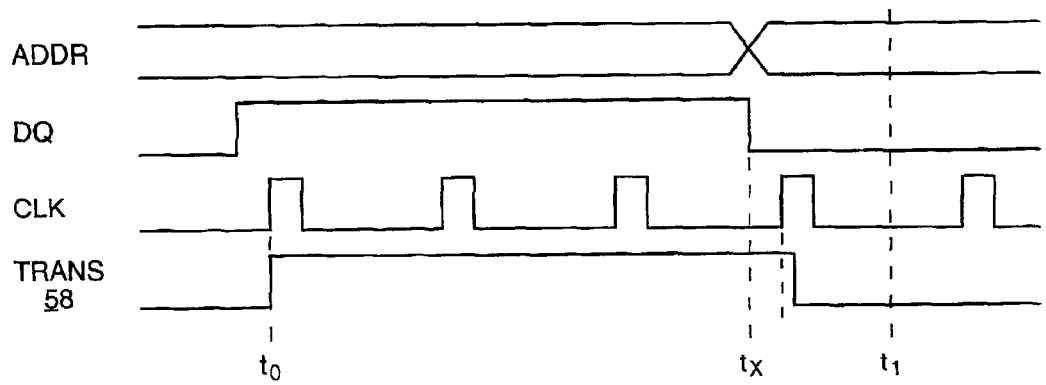

As mentioned briefly above, repairing a chip may involve blowing an anti-fuse, wherein doing so may isolate at least one cell formerly related to an address and associate at least one redundant cell with that address. In order to blow an anti-fuse, such as anti-fuse 56 in FIG. 6, for example, the voltage difference between the conductive elements of anti-fuse 56 must be great enough for long enough to break down the dielectric between those conductive elements. In the current non-limiting example, it has been assumed that parameters sufficient to blow anti-fuse 56 include one conductive element of anti-fuse 56 having a voltage of CGND and the other having a voltage of ground for at least two milliseconds. FIG. 6 illustrates that one conductive element of anti-fuse 56 is coupled to CGND. However, the other conductive element of anti-fuse 56 is in electrical communication with ground only when transistor 58 is on. Thus, transistor 58 should be on for at least two milliseconds in order to blow anti-fuse 56. It follows that the signal output from anti-fuse logic circuit 52 must drive the gate of transistor 58 for at least two milliseconds. In the prior art, that required the signals input to the anti-fuse logic circuit 52 to be maintained for at least two milliseconds—which FIG. 11A represents as the time spanning from $t_0$ to $t_1$. FIGS. 11A–C further illustrates a specific example of the prior art input signals and their required timing, wherein the first address and a high DQ signal are transmitted to the anti-fuse logic 52 through the appropriate inputs during the time spanning from $t_0$ to $t_1$. Once the address signal or DQ change, the signal to transistor 58 will change soon thereafter. In FIG. 11A, the anti-fuse logic 52 is synchronous with respect to both the address and DQ signals; that is, a change in those signals will not affect the output of the anti-fuse logic 52 until the next rising edge of the clock signal CLK. If one of the signals ADDR or DQ were asynchronous, then the change in output would not wait for the next clock pulse. Rather, given the command timing in FIG. 11A, the signal to transistor 58 would change shortly after time $t_1$, once the change in ADDR or DQ propagated through the anti-fuse logic 52. Given the time spanned by the address and DQ signals in FIG. 11A, asynchronous signals would persist long enough to blow anti-fuse 56.

It is desirable to reconfigure the input signals as soon as possible in order to have the option to blow the next anti-fuse and generally shorten repair time, but FIG. 11B illustrates what happens if the signals are asynchronous and are changed before time $t_1$. If either the ADDR or DQ signal change at a time $t_X$ before $t_1$, then the signal driving transistor 58 changes once the change in ADDR or DQ propagate through the anti-fuse logic 52—too soon to ensure a complete blowing of anti-fuse 56. Even if the signals were synchronous, there might be a delayed effect from changing ADDR or DQ given that the results of the change will not be effective until the next clock pulse. Nevertheless, as shown in FIG. 11C, that delay may still be insufficient.

Figure 12:
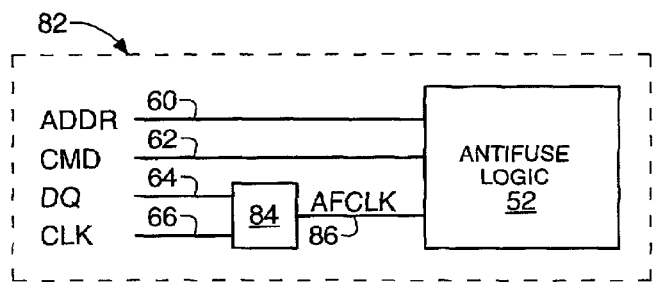
FIG. 12 depicts a portion of circuitry addressed by an exemplary embodiment of the current invention.
Figure 13A:
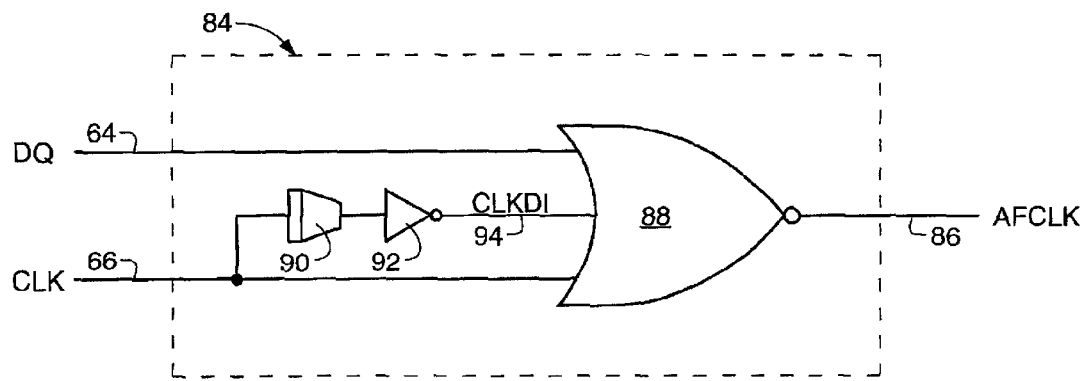
FIGS. 13A and B depict portions of circuitry addressed by exemplary embodiments of the current invention.
Figure 13B:
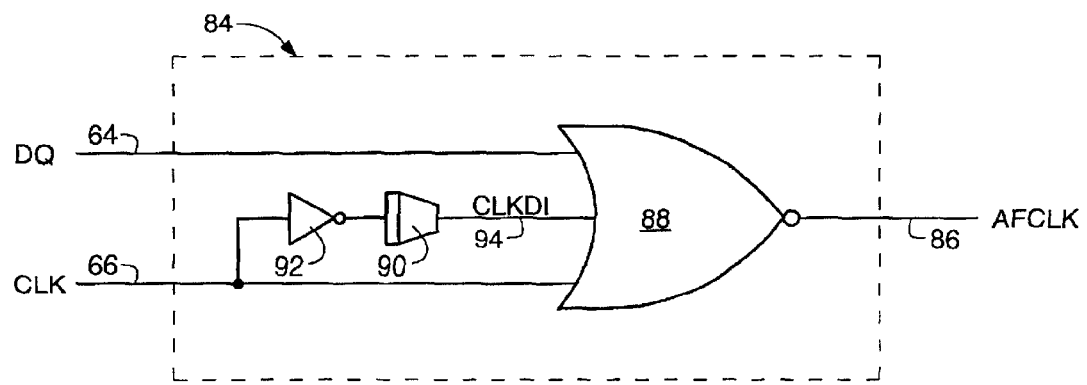

At least some exemplary embodiments of the current invention offer an alternative to the repair schemes of the prior art. For example, in FIG. 12's circuitry included as part of a chip 82, the signals DQ 64 and CLK 66 are intercepted before being input to the synchronous anti-fuse logic 52 and instead undergo logic operations within an anti-fuse clock circuit 84. The result is an anti-fuse clock signal AFCLK 86 that governs the synchronous functions of anti-fuse logic 52. In at least one exemplary embodiment of the current invention, anti-fuse clock signal AFCLK 86 may allow reconfiguring input signals before the critical time $t_1$ yet may help to ensure complete blowing of the anti-fuse operated upon before the signal reconfiguration. One example of anti-fuse clock circuit 84 appears in FIG. 13A, wherein signals DQ 64 and CLK 66 serve as two of three inputs for a NOR gate 88. The third input, CLKDI 94, is the result of having sent the clock signal CLK 66 through a delay element 90 and an inverter 92. (In an alternate exemplary embodiment depicted in FIG. 13B, the delay element 90 and inverter 92 are switched.) Given the truth table associated with the NOR logic operation, the only time the output AFCLK 86 transmits a high voltage signal is in response to DQ 64, CLK 66, and CLKDI 94 transmitting low voltage signal at the same time. The anti-fuse logic 52 is configured to react to input signal changes after a change in the anti-fuse clock signal AFCLK 86 rather than a change in the clock signal CLK 66.

Figure 14:
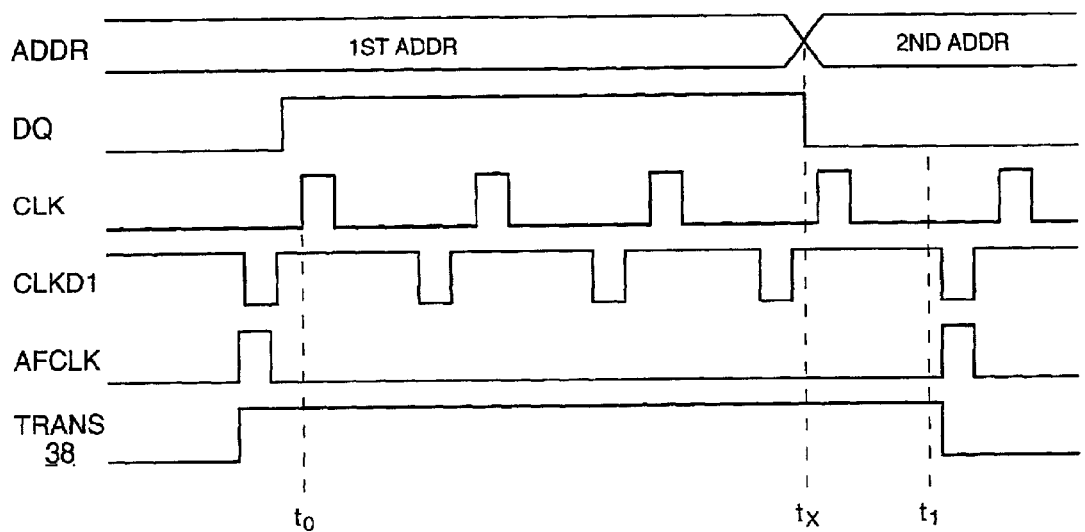
FIG. 14 shows a timing diagram illustrating a command sequence and effects thereof as part of an exemplary embodiment of the current invention.

An example of this is illustrated in FIG. 14, which displays the same address, DQ, and clock signals as FIGS. 11B and 11C. As in FIGS. 11B and 11C, the address and clock signals, while beginning before $t_0$, also end before $t_1$, a circumstance which risks an incomplete blowing of the relevant anti-fuse in the prior art. FIG. 14, however, also shows that the delay element 90 can be configured such that, even though the address signal ADDR 60 and/or the DQ 64 are changed at a time $t_X$ before time $t_1$, the circumstance of DQ 64, CLK 66, and CLKDI 94 being low at the same time does not occur until after $t_1$. As a result, there will be no AFCLK 86 pulse between $t_X$ and $t_1$. Rather, the relevant clock pulse of AFCLK 86 will not occur until after $t_1$. Thus, a second address may be transmitted in parallel to multiple chips having the configuration of FIG. 12 and/or the DQ's transmitted to each such chip may be altered based on what is preferred for the second address, yet each chip will continue to internally maintain the signals necessary to blow the anti-fuse associated with the first address.

Exemplary embodiments of the current invention addressing the timing of input signals transmitted during repair may be used in conjunction with input signals wherein the DQ signal determines whether the command to blow an anti-fuse is ignored or where the DQ signal may have alternative effects, such determining which fuses are to be used. Moreover, exemplary embodiments of the current invention addressing the timing of input signals for repair may be used with or without the error detect or "Smart Repair" features discussed above.

Figure 15:
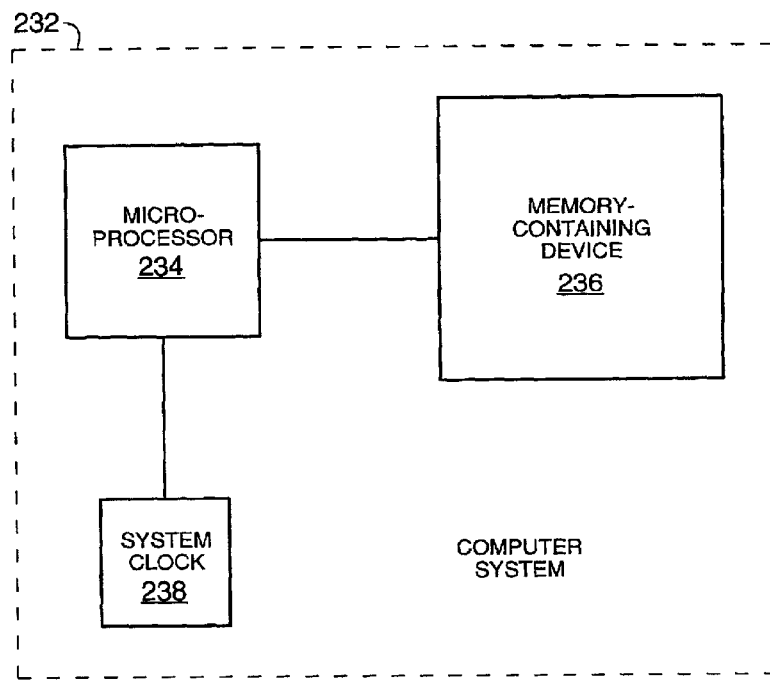
FIG. 15 depicts another exemplary apparatus embodiment within the scope of the current invention.

Further, exemplary embodiments of the current invention, be they ones addressing error detection, smart repair, speedy repair, or combinations thereof, generally accommodate systems using memory, wherein the memory can include nonvolatile, static, or dynamic memory, and wherein the memory can be a discrete device, embedded in a chip with logic, or combined with other components to form a system on a chip. For example, FIG. 15 illustrates a computer system 232, wherein a microprocessor 234 transmits address, data, and control signals to a memory-containing device 236 such as one including but not limited to those described above. A system clock circuit 238 provides timing signals for the microprocessor 234.

One skilled in the art can appreciate that, although specific embodiments of this invention have been described above for purposes of illustration, various modifications may be made without departing from the spirit and scope of the invention. For example, the error detection or repair methods described above may occur at any stage of die singulation, including but not limited to states in which the chip's die is part of a wafer, integral with at least one other die yet separate from a wafer, or completely singulated from all other die. Further, the error detection or repair methods may occur at any stage of packaging, ranging from a bare die to a fully packaged chip, although it is preferred to carry out testing and repair methods of the current invention with a fully packaged chip. Error detection or repair methods can occur on any device capable of handling the chip based on its state of singulation or packaging, including AMBYX and TERADYNE devices. Error detection or repair methods can occur during a test, probe, or burn-in (including cold burn-in) process. Concerning the function in at least some exemplary embodiments of storing a single address, it is not required under all exemplary embodiments of the current invention to store the last address. Rather, the current invention includes within its scope embodiments wherein the first failed address and only the first address (if any) is stored. Moreover, at least some error detection or repair methods of the current invention may be used in either compression or non-compression data transfer test modes. Accordingly, the invention is not limited except as stated in the claims.

What is claimed is:

1. A method of processing a memory chip, comprising:
   checking a group of memory cells on said memory chip for a defect; and
   storing in a first register a column address of any defective memory cell found during said act of checking, wherein said act of storing results in removing any other column address stored in said first register, and wherein said act of storing comprises storing said column address without a row address of said any defective memory cell.

2. The method in claim 1, wherein said act of storing comprises storing said column address in a first register located on said memory chip.

3. The method in claim 2, further comprising an act of repairing said memory chip based on data stored in said first register.

4. The method in claim 3, wherein said act of repairing comprises repairing said memory chip further based on data stored in a second register indicating redundant element availability.

5. The method in claim 4, further comprising:
   providing a signal related to blowing a programmable element associated with a column address stored in said first register;
   halting said signal before fully programming said programmable element; and
   completely programming said programmable element despite said act of halting said signal.

6. A method of repairing a memory circuit comprising a plurality of memory cells, wherein at least one memory cell of said plurality tests as defective, said method comprising:
   associating redundant memory cells with each memory address incorporating a column address of a memory cell that tests as defective; and providing said column address to circuitry on said memory circuit, wherein said circuitry is configured to carry out said act of associating, wherein said act of providing comprises providing said column address from a first register included as a part of said memory circuit, and wherein said first register is configured to store said column address to the exclusion of any other column address at the same time.

7. The method in claim 6, further comprising an act of isolating main memory cells initially related to said column address.

8. The method in claim 7, further comprising:
searching for at least one available redundant memory cell;
recording data relating to availability of said at least one redundant memory cell on a second register; and
providing said data to said circuitry.

9. The method in claim 8, wherein said act of associating redundant memory cells comprises programming at least one programmable element coupled to at least one of said redundant memory cells.

10. The method in claim 9, wherein:
said act of programming comprises transmitting an input signal to said circuitry;
said act of associating redundant memory cells comprises transmitting from said circuitry an output signal in response to said circuitry receiving said input signal, wherein said output signal is used to program said at lease one programmable element; and
said act of transmitting an input signal comprises transmitting said input signal for a time less than that needed to program said at least one programmable element.

11. A method of preparing to repair a memory array on a die having a first redundant plane comprising at least a first redundant element and a second redundant plane comprising at least a second redundant element, said method comprising:
searching for a first available redundant element within said first redundant plane and a second available redundant element within said second redundant plane; and
storing in a first register data related to said first available redundant element and to said second available redundant element, wherein said memory array and said first register share a common substrate.

12. The method in claim 11, wherein said act of providing a first redundant plane comprises providing a first redundant plane configured to accommodate at most a first portion of memory cells of said memory array.

13. The method in claim 12, wherein said act of providing a second redundant plane comprises providing a second redundant plane configured to accommodate at most a second portion of memory cells of said memory array, said second portion being discrete from said first portion.

14. The method in claim 13, wherein said act of searching comprises searching for a column of available redundant elements, wherein said column comprises at least one cell from said first redundant plane and one cell from said second redundant plane; and wherein said act of storing comprises storing over time data related to all available redundant columns.

15. The method in claim 14 wherein said act of storing over time comprises storing at any particular time data related to at most one available redundant column.

16. The method in claim 15, wherein said act of storing over time comprises storing data related to only the latest available redundant column found during said act searching.

17. The method in claim 16, wherein said act of storing over time comprises ultimately storing data related to only a last available redundant column found during said act of searching.

18. The method in claim 17, further comprising:
providing a third redundant plane for said memory array, wherein said third redundant plane comprises at least a third redundant element, and wherein said second redundant plane is configured to accommodate at most a third portion of memory cells of said memory array;
searching for any available redundant column at least partially within said third redundant plane; and
storing in a second register data related to an available redundant column within said third redundant plane, wherein said memory array and said second register share said common substrate.

19. A method of allowing repair of a memory array in a packaged part, wherein said memory array comprises a plurality of redundant planes, and wherein said plurality is configured to accommodate all rows of at least one column address in said memory array, wherein each plane of said plurality comprises at most a portion of at least one redundant column, said method comprising:
checking said plurality for redundant columns that remain available from any earlier repair procedure; and
storing information relating to an available redundant column, wherein said act of storing is accomplished using a redundancy register corresponding to said plurality.

20. The method in claim 19, wherein said act of storing information comprises storing a redundant column address of said available redundant column.

21. The method in claim 20, wherein said act of storing information comprises refraining from storing a redundant row address of said available redundant column.

22. The method in claim 21, further comprising an act of programming multiple programmable elements in multiple redundant planes, wherein addresses of said multiple programmable elements are respectively stored in said plurality of redundancy registers.

23. The method in claim 22, further comprising:
providing an address register for said memory array;
checking for an error in a cell included in said memory array; and
storing information relating to said error in said address register.

24. The method in claim 23, wherein said act of providing an address register comprises providing an address register within said packaged part; and wherein said act of storing information relating to said error comprises storing a column address, to the exclusion of a row address, of a cell having said error.

25. A method of operating a plurality of redundant planes of a memory device, comprising:
identifying a memory cell of said memory device that fails a test; and
accessing at least one redundant element in each plane of said plurality of redundant planes, wherein one redundant element of said at least one redundant element replaces said memory cell.

26. The method in claim 25, wherein said act of accessing comprises associating said at least one redundant element in said each plane with a respective memory address.

27. The method in claim 26, wherein said act of accessing comprises programming at least one programmable element.

28. The method in claim 27, wherein said act of programming comprises blowing at least one anti-fuse.

29. The method in claim 28, wherein said act of accessing comprises accessing at least one redundant element in each plane of said plurality of redundant planes, wherein every redundant element of said at least one redundant element has a common column address.

30. Input circuitry for a logic circuit of a memory device, wherein said logic circuit is configured to allow access to at least one redundant memory cell of said memory device, said circuitry comprising a register on said memory device, coupled to said logic circuit, and configured to store data relevant to an available redundant memory cell.

31. The circuitry of claim 30, wherein said register is configured to store data relevant to an available redundant memory column.

32. The circuitry of claim 31, wherein said register is configured to store data relevant to every available redundant memory column found during a search for an available redundant column.

33. The circuitry of claim 32, wherein said register is sized to store data relevant to at most one available redundant memory column found during said search for an available redundant column.

34. The circuitry of claim 33, wherein said register is configured to store data relevant to at most one available redundant memory column at a time.

35. The circuitry of claim 34, wherein said register is configured to store data relevant to a last available redundant memory column found by a conclusion of said search.

36. A repair system for a memory device comprising at least one redundant plane, said system comprising:

a first address storage device included as a part of said memory device, wherein said first address storage device is configured to store an address associated with at least one redundant plane of said memory device, wherein said first address storage device is configured to store an address associated with a first plurality of redundant planes; and a second address storage device configured to store an address associated with at least one redundant plane of said memory device, wherein said second address storage device is configured to store an address associated with a second plurality of redundant planes, and wherein said second plurality of redundant planes is discrete from said first plurality of redundant planes.

37. A computer system, comprising:

a microprocessor;

a system clock circuit coupled to said microprocessor; and a memory-containing device coupled to said microprocessor and comprising:

an array of primary memory cells, an array of redundant memory cells, a bank of programmable elements coupled to said array of primary memory cells and said array of redundant memory cells, logic circuitry coupled to said bank of programmable elements, wherein said logic circuitry is configured to control a programming state of said programmable elements, and a system clock modifier coupled to said logic circuitry and to said system clock.

38. The computer system of claim 37, further comprising a register coupled to said logic circuitry and sized to store at most one column address of a primary memory cell.

39. The computer system of claim 37, further comprising a register coupled to said logic circuitry and sized to store at most one column address of a redundant memory cell.

40. Redundancy circuitry for a chip, comprising:

a plurality of redundant memory cells on said chip, wherein said cells are organized into at least one redundant row, at least one redundant column, and at least two redundant planes; and a storage device on said chip configured to store data relevant to multiple redundant planes.

41. The circuitry in claim 40, wherein said storage device is configured to store data relevant to at most one redundant column.

42. The circuitry in claim 41, wherein said storage device is configured to store data relevant to at least one redundant row.

43. The circuitry in claim 42, wherein said storage device is configured to store only a column address.

44. A storage system for a memory device on a semiconductor die, said system comprising:

a first storage device on said die and configured to store at most a partial memory address; and a second storage device on said die and configured to store at most a partial memory address.

45. The system in claim 44, wherein said first storage device is configured to store at most a partial memory address of a main memory array of said memory device.

46. The system in claim 45, wherein said second storage device is configured to store at most a partial memory address of a redundant memory array of said memory device.

47. The system in claim 46, wherein said first storage device is configured to store a column address of said main memory array without a row address of said main memory array; and wherein said second storage device is configured to store a column address of said redundant memory array without a row address of said redundant memory array.

48. The system in claim 44, wherein said first storage device is configured to store at most a first partial memory address of a redundant memory array of said memory device; and wherein said second storage device is configured to store at most a second partial memory address of said redundant memory array.

49. The system in claim 48, wherein said redundant memory array comprises a plurality of redundant planes; and wherein said first partial memory address and said second partial memory address are incorporated into separate redundant planes.

50. Repair circuitry for a memory chip, comprising:

at least one redundant plane organized from memory cells of a redundant array on said chip; and at least one register on said memory chip and configured to store data relevant to at least one redundant plane.

51. The circuitry in claim 50, wherein:

said at least one redundant plane comprises at least two redundant planes incorporating different memory cells from any one column of said redundant array; and said at least one register comprises a register configured to store only a redundant column address of any one column of said redundant array.

52. The circuitry in claim 50, further comprising:

a redundant plane organized to incorporate at most a portion of any column of said redundant array; and a register configured to store a redundant column address of any one column of said redundant array without storing any row address of said redundant array.

53. The circuitry of claim 50, wherein said at least one register comprises a register configured to store a redundant column address and further configured to exclude from storage a redundant row address; and wherein memory cells having said redundant column address are divided among at least two redundant planes.

54. Redundancy circuitry for a memory chip, comprising:
   a redundant memory array on said memory chip and organized into at least one column, wherein said redundant memory array is organized into a plurality of redundant planes, and wherein a totality of cells within each column of said plurality are divided among at least one group of redundant planes from said plurality; and
   at least one register on said memory chip and configured to store a column address of said redundant memory array.

55. The circuitry in claim 54, wherein said at least one register corresponds in number to said at least one group of redundant,planes, and wherein each register of said at least one register is configured to store a column address of a column associated with a group of redundant planes.

56. A method of repairing a memory chip, comprising:
   identifying a defective memory cell on said chip;
   storing a column address of said defective memory cell in a first register on said chip;
   identifying an available column of redundant memory cells on said chip;
   storing a column address of said available column of redundant memory cells in a second register on said chip; and
   replacing all memory cells sharing said column address of said defective memory cell with said available column of redundant memory cells.

57. The method in claim 56, wherein said act of replacing comprises:
   accessing said available column of redundant memory cells using logic circuitry; and
   using data from said second register as input to said logic circuitry.

58. The method in claim 57, further comprising clearing said second register.

59. The method in claim 58, further comprising:
   clearing said first register;
   identifying another defective memory cell on said chip;
   storing a column address of said another defective memory cell in said first register;
   identifying another available column of redundant memory cells on said chip;
   storing a column address of said another available column of redundant memory cells in said second register; and
   replacing all memory cells sharing said column address of said another defective memory cell with said another available column of redundant memory cells.

60. A method of preparing to repair a memory array on a chip, said method comprising:
   searching for all available columns of redundant elements; and
   storing on said chip an address of an available column of redundant elements found during said act of searching.

61. The method in claim 60, wherein said storing act comprises storing an address of the first available column of redundant elements found during said act of searching.

62. The method in claim 61, wherein said act of storing an address of the first available column comprises storing an address of said first available column to the exclusion of storing any other available column of redundant elements found during said act of searching.

63. The method in claim 61, further comprising scoring an address of another available column of redundant elements found during said act of searching.

64. The method in claim 63, further comprising storing an address of the last available column of redundant elements found during said act of searching.

65. The method in claim 64, wherein said act of storing an address of the last available column comprises:
   storing said last available column in a register; and
   clearing from said register any previously-stored address.

66. A method of storing data for a memory device, comprising:
   providing a device on a semiconductor die, wherein said die incorporates said memory device; and
   storing in said device data relating to a plurality of memory cells, wherein said storing act comprises storing address data common to a plurality of memory cells.

67. The method in claim 66, wherein said storing act comprises refraining from storing address data that is uncommon to said plurality of memory cells.

68. The method in claim 67, wherein said storing act comprises scoring a row address.

69. A method of storing data for a memory device, comprising:
   providing a device on a semiconductor die, wherein said die incorporates said memory device; and
   storing in said device data relating to a plurality of memory cells, wherein said storing act comprises storing a column address, and wherein said storing act comprises storing a column address of a plurality of unused memory cells in a redundant array of said memory device.

70. A method of handling a memory device, comprising:
   testing for at least one bad cell in said memory device;
   storing on said memory device a partial address of a final bad cell identified during said testing act; and
   incorporating said memory device into a computer system.

71. The method in claim 70, wherein said incorporating act comprises incorporating said memory device into said computer system after said testing act.

72. A method of repairing a plurality of memory die, comprising:
   replacing a first plurality of memory cells of one memory die with a second plurality of memory cells;
   storing on said one memory die at most a partial address common to said second plurality of memory cells;
   replacing a third plurality of memory cells of another memory die with a fourth plurality of memory cells; and
   storing on said another memory die at most a partial address common to said fourth plurality of memory cells.

73. The method in claim 72, further comprising locating said one memory die and said another memory die on a tester during said acts of replacing a first plurality and replacing a third plurality.

74. The method in claim 72, further comprising:
- singulating said one memory die and said another memory die;
- establishing electrical communication between a common component and said one memory die;
- establishing electrical communication between said common component and said another memory die; and
- testing said one memory die and said another memory die using said common component.

75. The method in claim 74, wherein said act of establishing electrical communication between a common component and said one memory die comprises establishing electrical communication between a tester and said one memory die.

76. The method in claim 74, further comprising at least partially packaging said one memory die before said testing act.

77. The method in claim 76, further comprising fully packaging said one memory die and said another memory die before said testing act.

* * * * *

UNITED STATES PATENT AND TRADEMARK OFFICE
CERTIFICATE OF CORRECTION

PATENT NO.     : 6,918,072 B2
DATED          : July 12, 2005
INVENTOR(S)    : Timothy B. Cowles et al.

It is certified that error appears in the above-identified patent and that said Letters Patent is hereby corrected as shown below:

Title page,
Item [56], References Cited, OTHER PUBLICATIONS,
"Micron Technology, Inc.; "Synchronous DRAM" Data Sheets; 128Mb: x32 SDRAM: x32 DRAM, 128MbSDRAMx32, p65—Rev. Sep. 2000, pp. 1-52." should read
-- Micron Technology, Inc.; "Synchronous DRAM" Data Sheets; 128Mb: x32 SDRAM, 128Mb: x32 DRAM, 128MbSDRAMx32, p65 - Rev. Sep. 2000, pp. 1-52. --.

Column 1,
Line 55, "256 chip" should read -- 256 chips --;

Column 13,
Line 2, "address" should read -- addresses --;

Column 14,
Line 39, "illustrates" should read -- illustrate --;

Column 21,
Line 18, "redundant,planes" should read -- redundant planes --; and

Column 22,
Line 31, "scoring" should read -- storing --.

Signed and Sealed this

Twenty-eighth Day of February, 2006

JON W. DUDAS
*Director of the United States Patent and Trademark Office*